United States Patent
Ito et al.

(10) Patent No.: US 8,324,594 B2
(45) Date of Patent: Dec. 4, 2012

(54) CHARGED PARTICLE BEAM APPARATUS

(75) Inventors: Hiroyuki Ito, Hitachinaka (JP); Yuko Sasaki, Mito (JP); Tadashi Otaka, Hitachinaka (JP)

(73) Assignee: Hitachi High-Technologies Corporation, Osaka (JP)

( * ) Notice: Subject to any disclaimer, the term of this patent is extended or adjusted under 35 U.S.C. 154(b) by 454 days.

(21) Appl. No.: 12/370,242

(22) Filed: Feb. 12, 2009

(65) Prior Publication Data

US 2009/0218509 A1    Sep. 3, 2009

(30) Foreign Application Priority Data

Feb. 28, 2008    (JP) .................. 2008-047027

(51) Int. Cl.
*G01F 23/00*    (2006.01)
*G21K 5/08*    (2006.01)
*G21K 5/10*    (2006.01)

(52) U.S. Cl. .................. 250/440.11; 250/306; 250/307; 250/310; 250/311; 250/442.11

(58) Field of Classification Search .................. 250/306, 250/307, 310, 311, 440.11, 442.11
See application file for complete search history.

(56) References Cited

U.S. PATENT DOCUMENTS

| | | | | |
|---|---|---|---|---|
| 5,690,744 A * | 11/1997 | Landau | ........................ | 118/715 |
| 2006/0231773 A1 | 10/2006 | Katagiri et al. | | |
| 2007/0023651 A1 | 2/2007 | Ishitani et al. | | |

FOREIGN PATENT DOCUMENTS

| | | |
|---|---|---|
| JP | 2000-260376 | 9/2000 |
| JP | 2001-056306 | 2/2001 |
| JP | 2006-294481 | 10/2006 |
| JP | 2007-18934 | 1/2007 |

OTHER PUBLICATIONS

Hatamura, Y., Nakao, M., and Sato, T, "Construction of an Integrated Manufacturing System for 3D Microstructure—Concept, Design and Realization", Cirp Annals—Manufacturing Technology, vol. 46, pp. 313 to 318, 1997.*
Japanese Office Action issued in Japanese Patent Application No. JP 2008-047027 dated Aug. 17, 2010.

* cited by examiner

*Primary Examiner* — Jack Berman
*Assistant Examiner* — Meenakshi Sahu
(74) *Attorney, Agent, or Firm* — McDermott Will & Emery LLP

(57) ABSTRACT

A charged particle beam apparatus can be constructed with a smaller size (resulting in a small installation space) and a lower cost, suppress vibration, operate at higher speed, and be reliable in inspection. The charged particle beam apparatus is largely effective when a wafer having a large diameter is used. The charged particle beam apparatus includes: a plurality of inspection mechanisms, each of which is mounted on a vacuum chamber and has a charged particle beam mechanism for performing at least an inspection on the sample; a single-shaft transfer mechanism that moves the sample between the inspection mechanisms in the direction of an axis of the single-shaft transfer mechanism; and a rotary stage that mounts the sample thereon and has a rotational axis on the single-shaft transfer mechanism. The single-shaft transfer mechanism moves the sample between the inspection mechanisms in order that the sample is placed under any of the inspection mechanisms. The rotary stage positions the sample such that a target portion of the sample can be inspected by the inspection mechanism under which the sample is placed, and the inspection mechanisms inspect the sample.

8 Claims, 8 Drawing Sheets

CHARGED PARTICLE BEAM APPARATUS

BACKGROUND OF THE INVENTION

1. Field of the Invention

The present invention relates to a charged particle beam apparatus that uses a charged particle beam such as an electron beam and an ion beam to observe and process a sample.

2. Description of the Related Art

In objects observed by a charged particle beam apparatus, a semiconductor device has a circuit pattern which has been miniaturized. Therefore, in addition to increase the sensitivity of an optical system, methods for inspecting and processing a semiconductor wafer by using a charged particle beam have attracted attention. An inspection device using a scanning electron microscope (SEM) has been developed. In order to inspect a semiconductor wafer on which a semiconductor device is formed, a defect review SEM and a critical dimension SEM are used. The defect review SEM is designed to use an optical image or an image obtained by scanning using a charged particle beam, detect a defect based on the image, and observe and categorize the defect. The critical dimension SEM is designed to measure the size of a pattern. In addition, the following techniques have been development: a technique for processing a defect using a focused ion beam (FIB) system; a technique for observing inclination of a sample using a SEM; a technique for analyzing a defect using an X ray; and the like. The structure and material of the semiconductor device have become increasingly complex. It has therefore been general that multiple inspection methods are used to organize inspected data. A device having multiple inspection functions has been proposed (refer to, for example, JP-A-2006-294481A1). On the other hand, there is a tendency that the diameter of a semiconductor device increases. Especially, since a charged particle beam scheme requires a vacuum chamber, a charged particle beam apparatus needs to have a large size. These affairs result in an increase in cost of an inspection system, reduction in the throughput of the device due to the increase in the size, and increase in risk of attachment of a foreign material to a wafer during transfer of the wafer in the complex inspection processes. This causes reduction in reliability for the inspection which is the most important matter primarily. The sizes of positioning stages provided in an electron beam device and an ion beam device have increased. This result in an increase in resistance required for driving each stage and an increase in residual vibration. Therefore, as well as decreasing of accuracy of the inspection and increasing of the time period to move the stage, increase in the time period for evacuation leads to a reduction in the throughput of the device. Installment of an inspection device having a large vacuum chamber in an expensive clean room may burden a user of the device with a large cost.

SUMMARY OF THE INVENTION

An object of the present invention is to provide a charged particle beam apparatus, which can be constructed with a smaller size (resulting in a small installation space) and a lower cost, suppress vibration, operate at higher speed, and be reliable in inspection. The charged particle beam apparatus is largely effective when a wafer having a large diameter is used.

To accomplish the above object, the charged particle beam apparatus according to the present invention comprises: a plurality of inspection mechanisms, each of which is mounted on a vacuum chamber and has a charged particle beam mechanism for performing at least one inspection on the sample; a single-shaft transfer mechanism that moves the sample between the inspection mechanisms in the direction of an axis of the single-shaft transfer mechanism; and a rotary stage that mounts the sample thereon and has a rotational axis on the single-shaft transfer mechanism, wherein the single-shaft transfer mechanism moves the sample between the inspection mechanisms in order that the sample is placed under any of the inspection mechanisms. The rotary stage positions the sample such that a target portion of the sample can be inspected by the inspection mechanism under which the sample is placed, and the inspection mechanisms inspect the sample.

As described above, the charged particle beam apparatus according to the present invention can be constructed with a smaller size (resulting in a small installation space) and a lower cost, suppress vibration, operate at higher speed, and be reliable in inspection. The charged particle beam apparatus is largely effective when a wafer having a large diameter is used.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

An embodiment of the present invention is described below. In order to accommodate to the increase in the diameter of a wafer and complex inspection processes, a plurality of inspection mechanisms are mounted on a single vacuum chamber, and a rotary stage and a single-shaft transfer mechanism are used to move a sample. That is, the single-shaft transfer mechanism is used to transfer the sample between the inspection mechanisms, and the rotary stage and a single-shaft transfer stage are used to position a target portion of the sample wafer. This configuration makes it possible to use the vacuum chamber having a size equal to or smaller than the half the size of a conventional XY transfer stage, suppress an increase in the weight of a movable part, and reduce the size of a charged particle beam apparatus according to the present embodiment compared with conventional techniques. This reduces a space to install the charged particle beam apparatus and a cost of the device, compared with the conventional techniques. Further, since two inspection devices are mounted on the single vacuum chamber, this configuration can prevent a foreign material from being attached to the wafer during transfer of the wafer between the inspection devices. In addition, since the rotary stage can suppress unnecessary vibration, positioning of the sample can be performed at high speed. In addition, reliability in detection of a defect and in measurement of the size of the defect, and operability of the device, are improved by sharing image information obtained from each of the inspection mechanisms, with its supplementary information such as coordinates of the defect, the height and size of the defect, and contrast of the image. These effects are remarkable when a wafer having a large outer diameter of 450 millimeters or more is used.

Figure 1:
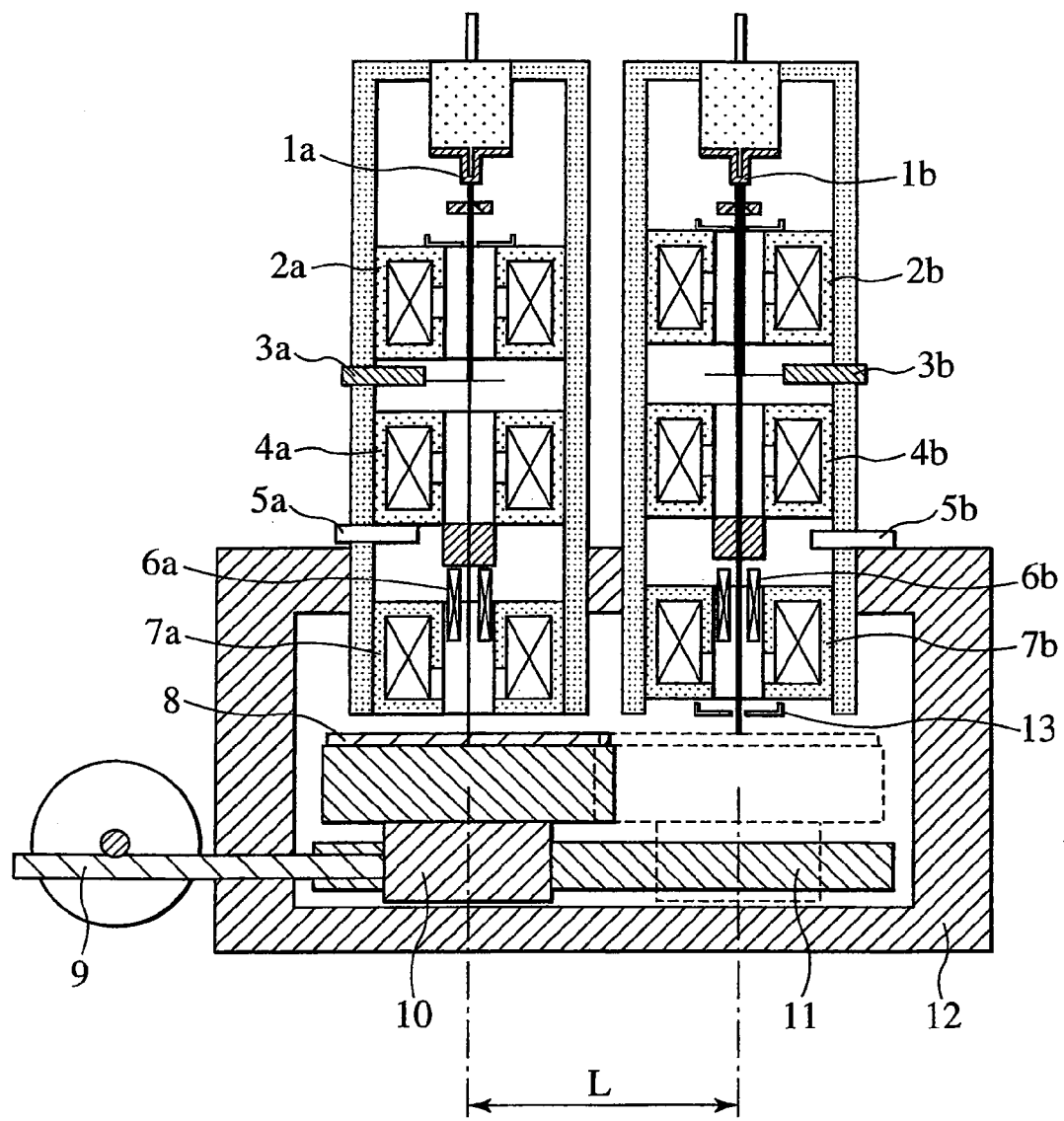
FIG. 1 is a vertical cross sectional view of an example of the outline configuration of a charged particle beam apparatus.

FIG. 1 is a vertical cross sectional view of the outline configuration of the charged particle beam apparatus. In FIG. 1, a wafer 8 is placed in a vacuum chamber 12. Two respective charged particle beam columns are mounted on the vacuum chamber 12. One of the charged particle beam columns is an SEM that irradiates the wafer 8 with an electron beam, detects a secondary signal generated from the wafer 8 and detects a defect based on the secondary signal. This SEM is hereinafter called a defect inspection SEM. The other one of the charged particle beam columns is an SEM that magnifies and images the defect detected by the defect inspection SEM, and categorizes the defect based on a characteristic amount of the defect. This SEM is hereinafter called a defect review SEM. A rotary stage 10 and a single-shaft transfer stage 11 are provided in the vacuum chamber 12. The wafer 8 is first positioned under the defect inspection SEM by the rotary stage 10 and the single-shaft transfer stage 11.

The defect inspection SEM inspects the entire surface of the wafer 8 although a spot size of the electron beam on the surface of the wafer is small. In order to reduce the number of times of scanning operations using the electron beam and create a single image at high speed, the defect inspection SEM uses a large current to irradiate the wafer 8 with the electron beam. The defect inspection SEM has an electron source 1b, a first irradiation lens 2b, a limiting diaphragm 3b, a second irradiation lens 4b, a detector 5b, a deflector 6b, and an objective lens 7b. A large current is supplied to the electron source 1b. Then, the electron source 1b emits an electron beam. The electron beam emitted by the electron source 1b is converged by the first irradiation lens 2b and the limiting diaphragm 3b. The convergence angle of the electron beam is controlled by the second irradiation lens 4b. Then, the objective lens 7b passes the electron beam and focuses the electron beam on the wafer 8. The deflector 6b deflects the electron beam to scan the wafer 8. After the objective lens 7b focuses the electron beam on the wafer 8, an image signal (secondary signal) is generated from the wafer 8. The detector 5b receives the image signal to obtain information (hereinafter referred to as defect information) on a defect present on the wafer 8 (sample). The defect inspection SEM has a control electrode 13. The control electrode 13 controls an electrostatic charge on the surface of the wafer 8 and the trajectory of the electron beam. The control electrode 13 allows for detection of a difference in potential due to the electrostatic charge, an insulated state, a foreign material, an irregularity of a pattern, and the like, with predetermined sensitivity.

Then, the single-shaft transfer stage 11 is driven by a drive system 9 to transfer the wafer 8 inspected and placed on the rotary stage 10 in the vacuum chamber 12 and place the inspected wafer 8 under the defect review SEM. The defect information includes coordinates of the defect, the size of the defect, contrast of the image, and the like. The defect information obtained by the defect inspection SEM is stored in a storage device (not shown) and used to search the defect by means of the defect review SEM.

The defect review SEM has an electron source 1a, a first irradiation lens 2a, a limiting diaphragm 3a, a second irradiation lens 4a, a detector 5a, a deflector 6a, and an objective lens 7a. The electron source 1a emits an electron beam. The electron beam emitted by the electron source 1a is converged by the first irradiation lens 2a and the limiting diaphragm 3a. A convergence angle of the electron beam is controlled by the second irradiation lens 4a. Then, the objective lens 7a passes the electron beam and focuses the electron beam on the wafer 8. The deflector 6a deflects the electron beam to scan the wafer 8. After the objective lens 7a focuses the electron beam on the wafer 8, an image signal (secondary signal) is generated from the wafer 8. The detector 5a receives the image signal and thereby obtains an image of the scanned wafer. The defect review SEM searches the defect based on the coordinates included in the defect information obtained by the defect inspection SEM. When the defect review SEM finds the defect, the defect review SEM magnifies and images the defect. A calculator (not shown) categorizes the type of the defect based on the image indicative of the defect. Therefore, a user can specify a process during which the defect is generated and identify the cause of the generation of the defect, based on the information related to the defect.

The charged particle beam apparatus having the configuration shown in FIG. 1 can efficiently perform the operations from the detection of the defect of the wafer 8 to the categorization of the defect at high speed and low risk. Since the defect inspection SEM performs comparison processing to obtain a difference between a reference image (not including a defect) and the image obtained by the inspection and thereby to extract the defect, the defect inspection SEM may erroneously detect a non-defective pixel (such as noise of an image) as a defect. The defect inspection SEM can easily inspect an area corresponding to coordinates of a defect that cannot be extracted by the defect review SEM.

Figure 2:
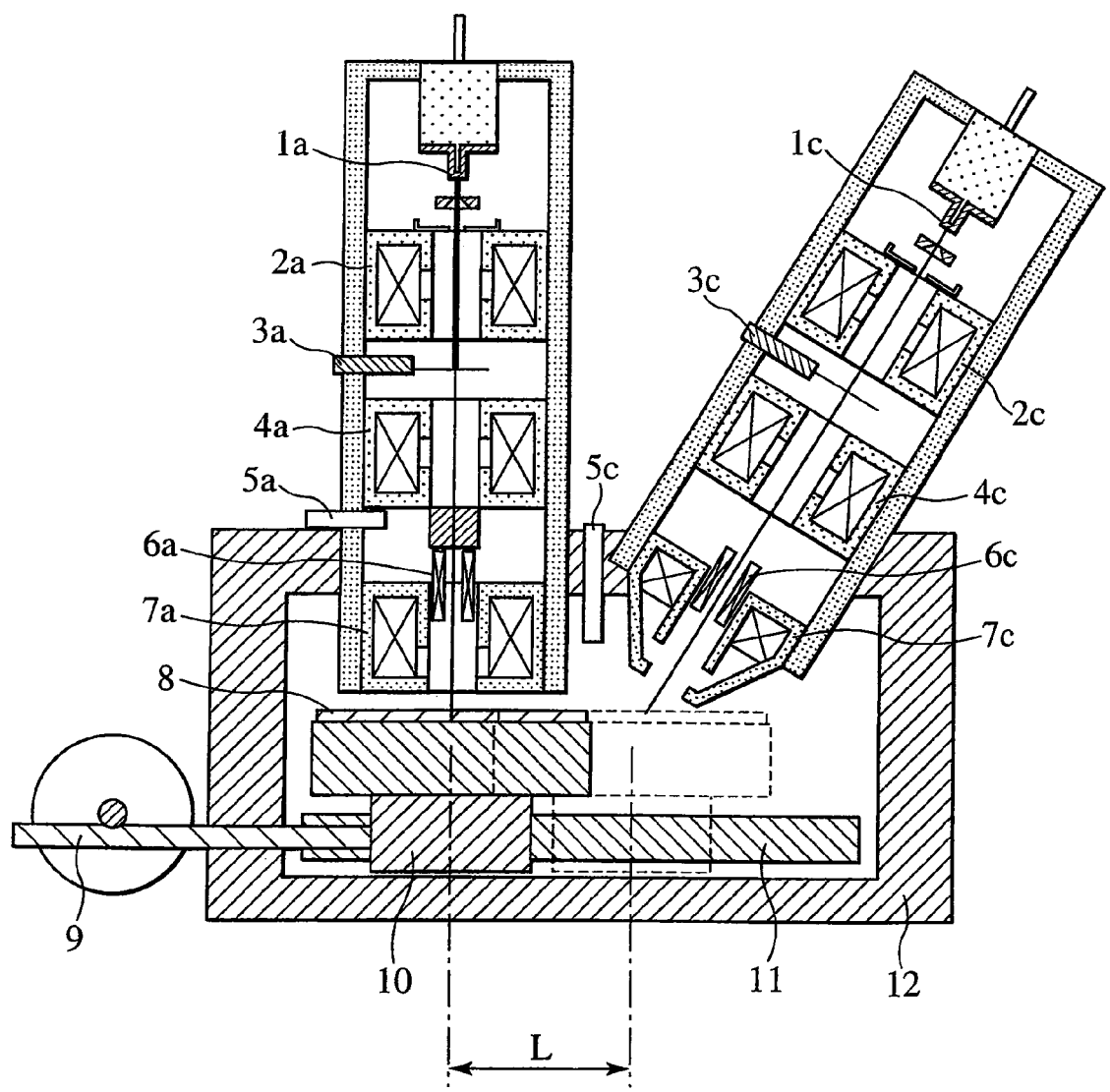
FIG. 2 is a vertical cross sectional view of another example of the outline configuration of the charged particle beam apparatus.

FIG. 2 is a vertical cross sectional view of another example of the outline configuration of the charged particle beam apparatus. The charged particle beam apparatus shown in FIG. 2 includes a defect review SEM and an SEM (hereinafter referred to as an oblique observation SEM) adapted to observe a sample from a direction oblique to a normal to the surface of the sample (wafer 8). The defect review SEM and the oblique observation SEM are mounted on the vacuum chamber 12. The defect review SEM shown on the left side of FIG. 2 has the same configuration and functions as those of the defect review SEM shown in FIG. 1. The oblique observation SEM shown on the right side of FIG. 2 has an electron source 1c, a first irradiation lens 2c, a limiting diaphragm 3c, a second irradiation lens 4c, a detector 5c, a deflector 6c, and an objective lens 7c. The electron source 1c emits an electron beam. The electron beam emitted by the electron source 1c is converged by the first irradiation lens 2c and the limiting diaphragm 3c. A spreading angle of the electron beam is then controlled by the second irradiation lens 4c. The objective lens 7c then passes the electron beam and focuses the electron beam on the wafer 8. The deflector 6c deflects the electron beam to scan the wafer 8. The detector 5c receives an image signal from the scanned wafer 8. An X ray detector may be added to the oblique observation SEM in order to analyze a material of a defect present on the surface of the sample (wafer).

In an inspection process, the deflector 6a provided in the defect review SEM deflects the electron beam to scan the wafer 8 at high speed. The defect review SEM obtains information (defect information) on the defect present on the wafer

8, such as the size of the defect, coordinates of the defect, and image contrast. That is, the defect review SEM obtains an image indicative of the defect. The defect review SEM categorizes the type of the defect based on the image indicative of the defect, and displays the defect. The rotary stage 10 provided on the single-shaft transfer stage 11 moves to place the wafer 8 (inspected by the defect review SEM) under the oblique observation SEM. The defect review SEM transmits the defect information to a controller (not shown) provided in the oblique observation SEM. The oblique observation SEM emits an electron beam and irradiates the wafer 8 with the electron beam from a direction oblique to a normal to the surface of the wafer 8. Then, the oblique observation SEM analyzes an irregularity of the defect and a component of the defect to obtain detail information on the defect. That is, the oblique observation SEM can observe the defect. It should be noted that the oblique observation SEM can observe an edge portion of the wafer 8 as well as from the oblique direction, since a defect such as abrasion may easily occur at the edge portion of the wafer 8.

Figure 3:
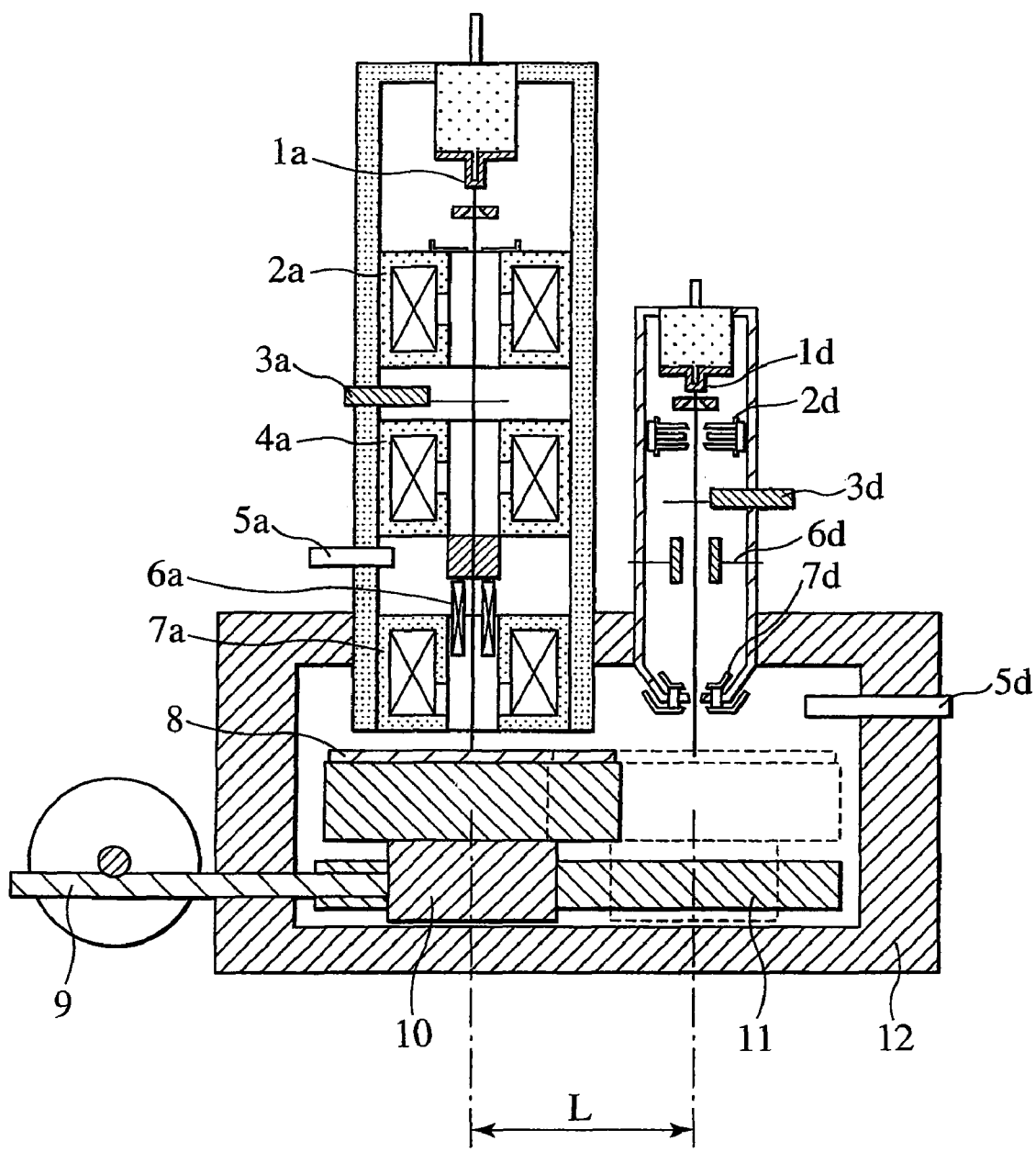
FIG. 3 is a vertical cross sectional view of another example of the outline configuration of the charged particle beam apparatus.

FIG. 3 is a vertical cross sectional view of another example of the outline configuration of the charged particle beam apparatus. The charged particle beam apparatus shown in FIG. 3 includes a defect review SEM and a focus ion beam (FIB) device. The defect review SEM and the FIB device are mounted on the single vacuum chamber 12. The defect review SEM shown on the left side of FIG. 3 has the same configuration and functions as those of the defect review SEM shown in FIG. 1. The FIB device has an ion source 1*d*, a static irradiation lens 2*d*, an ion current limiting diaphragm 3*d*, a detector 5*d*, a deflector 6*d*, and a static objective lens 7*d*. The ion source 1*d* emits an ion beam. The ion beam emitted by the ion source 1*d* is converged by the static irradiation lens 2*d* and the ion current limiting diaphragm 3*d*. The static objective lens 7*d* then passes the ion beam and focuses the ion beam on the wafer 8. The deflector 6*d* deflects the ion beam to scan the wafer 8. The detector 5*d* receives an image signal from the scanned wafer 8.

In an inspection process, the defect review SEM obtains information (defect information) on a defect present on the wafer 8, such as the size of the defect, coordinates of the defect, and image contrast. That is, the defect review SEM obtains an image indicative of the defect. The defect review SEM categorizes the type of the defect based on the image indicative of the defect, and displays the defect. The rotary stage 10 provided on the single-shaft transfer stage 11 moves to place the wafer 8 (inspected by the defect review SEM) under the FIB device. The defect review SEM transmits the defect information to a controller (not shown) provided in the FIB device. The FIB device cuts an image indicative of a wafer portion including the defect from the obtained image, and observes a three dimensional structure of the wafer portion including the defect through an X ray analysis.

Figure 4:
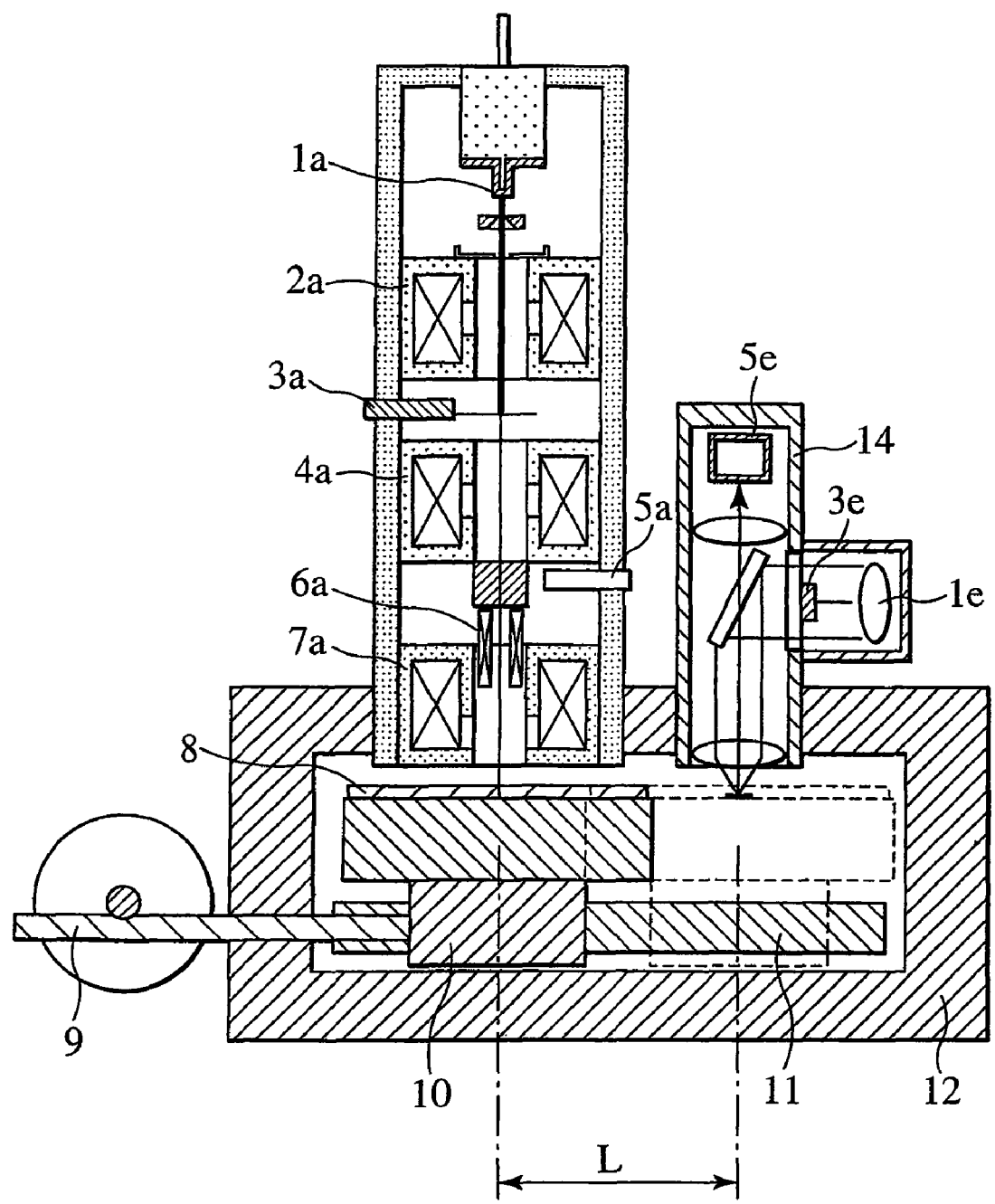
FIG. 4 is a vertical cross sectional view of another example of the outline configuration of the charged particle beam apparatus.

FIG. 4 is a vertical cross sectional view of another example of the outline configuration of the charged particle beam apparatus. The charged particle beam apparatus shown in FIG. 4 includes a defect review SEM and an optical inspection device. The defect review SEM and the optical inspection device are mounted on the single vacuum chamber 12. The defect review SEM shown on the left side of FIG. 4 has the same configuration and functions as those of the defect review SEM shown in FIG. 1. The optical inspection device has an optical source 1*e*, a limiting diaphragm 3*e*, an optical detector 5*d* and an optical microscope 14. The optical source 1*e* emits a light beam. The light beam emitted by the optical source 1*e* is focused on the wafer 8 by the limiting diaphragm 3*e* and the optical microscope 14. The optical detector 5*e* receives an image signal from the wafer 8. The optical inspection device has a magnification lower than that of the defect review SEM. Therefore, the optical inspection device inspects the entire surface of the wafer 8 to detect a defect present on the wafer 8, and then, the defect review SEM magnifies and images the defect present on the wafer 8 based on coordinates of the detected defect to observe the defect in detail. The optical inspection device may have a bright field system and a dark field system. When the optical inspection device has the dark field system, an optical source that emits a laser beam is used. In the case where the optical inspection device and the defect review SEM are separately provided, when the wafer 8 is inspected before a pattern is formed, accuracy of a coordinate correction performed by the optical inspection device and the defect review SEM is low. It is therefore difficult that the defect review SEM detects a defect detected by the optical inspection device. However, the charged particle beam apparatus shown in FIG. 4 has the optical inspection device and the defect review SEM, which are mounted on the vacuum chamber 12. In addition, the charged particle beam apparatus has the common stages shared by the optical inspection device and the defect review SEM. Therefore, an error in the coordinates does not occur. The defect review SEM can easily detect a defect detected by the optical inspection device.

Figure 5:
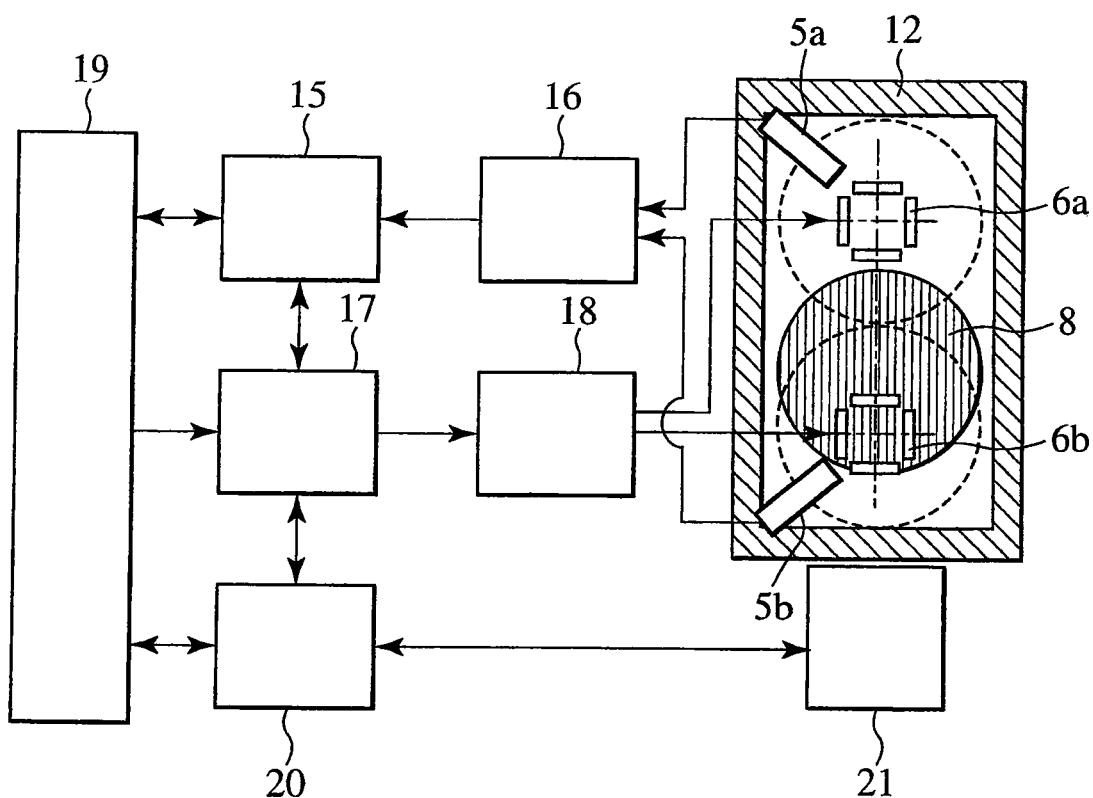
FIG. 5 is a plan cross sectional view of the outline configuration of the charged particle beam apparatus.

FIG. 5 is a plan cross sectional view of the outline configuration of the charged particle beam apparatus and shows the charged particle beam apparatus shown in FIG. 1 as an example. FIG. 5 illustrates the detector 5*a* and deflector 6*a* of the defect review SEM, and the detector 5*b* and deflector 6*b* of the defect inspection SEM. The vacuum chamber 12 has a small length and a large length. The small length of the vacuum chamber 12 is a distance between opposed inner walls of the vacuum chamber 12, and is obtained by adding a margin to the outer diameter of the wafer 8. The large length of the vacuum chamber 12 is a distance between opposed inner walls of the vacuum chamber 12, and is obtained by adding a margin to the double of the outer diameter of the wafer 8. The wafer 8 is moved by the single-shaft transfer stage 11 (not shown in FIG. 5) in a longitudinal direction of the single-shaft transfer stage 11 and rotated by the rotary stage 10 (not shown in FIG. 5) in the vacuum chamber 12. A calculator 19 performs both control of electron beam and processing of the image obtained. The calculator 19 transmits digital data indicative of the deflection of the electron beam to a deflection control circuit 17. The deflection control circuit 17 generates digital data (deflection control data) used to control the deflection of the electron beam, and transmits the generated deflection control data to a deflection drive circuit 18. The deflection drive circuit 18 receives the deflection control data from the deflection control circuit 17 and converts the deflection control data into an analog deflection control signal. The deflection drive circuit 18 transmits the analog deflection control signal to the deflector 6*a* or the deflector 6*b*. In addition, the calculator 19 transmits stage control data to a stage control circuit 20. The stage control circuit 20 transmits a stage drive signal to a stage drive circuit 21. The stage drive circuit 21 drives the rotary stage 10 and the single-shaft transfer stage 11 based on the stage drive signal.

The defect inspection SEM inspects the wafer 8, and the detector 5*b* detects an analog signal from the wafer 8. The detector 5*b* transmits the analog signal to a signal processing circuit 16. The signal processing circuit 16 converts the analog signal into a digital signal and transmits the converted digital signal to an image processing circuit 15. The image processing circuit 15 converts the digital signal into an image. The image processing circuit 15 compares the converted image with the reference image (not including a defect) to detect a defect and generate data (result data) on the result of the detection. The image processing circuit 15 transmits the result data to the calculator 19. The result data is stored in the storage device (not shown) provided in the calculator 19. Then, the wafer 8 is moved and placed under the defect review SEM. In this case, the wafer 8 is positioned in order that the defect review SEM detects the defect at a coordinate position of the defect included in the stored result data. The detector 5a detects a signal and transmits the detected signal through the signal processing circuit 16 to the image processing circuit 15 in the same manner as the detector 5b provided in the defect inspection SEM. The image processing circuit 15 converts the signal detected by the detector 5a into an image. The image processing circuit 15 compares the converted image with a reference image (not including a defect) to detect a defect. Alternatively, the image processing circuit 15 compares the converted image with the image stored and obtained by the defect inspection SEM to defect a detect. When the stage moves, a mechanical error may occur, and the position of the detected defect may be shifted due to the mechanical error. When the image processing circuit 15 cannot correct the shifted position of the defect, the deflection control circuit 17 controls the deflection of the electron beam to correct the shifted position of the defect. Alternatively, the stage control circuit 20 adjusts the position of the wafer 8 to correct the shifted position of the defect. After the defect is detected, the defect review SEM changes the magnification and images the defect at high magnification. The image obtained by the defect review SEM is stored in the storage device (not shown) provided in the calculator 19. The calculator 19 calculates a characteristic amount of the defect, such as the size and shape of the defect, based on the highly magnified image, and categorizes the defect. This calculation processing is repeated for the number of defects or the number of specified requirements. A plurality of pieces of information on the shifted position of the defect is stored in the storage device (not shown) provided in the calculator 19 as wafer position shift information. A technique such as a polynomial approximation method and an interpolation calculation of a memory map value can correct the shifted position of the defect with high accuracy. The calculator 19 adjusts a focal point of the electron beam emitted by the defect review SEM based on information on adjustment of the focal point of the electron beam. The information on the focal point of the electron beam is obtained by the defect inspection SEM when the defect inspection SEM obtains the image.

The movement of the single-shaft transfer stage 11 shown in FIG. 1 is detected by an existing laser interferometer (not shown). The rotation of the rotary stage 10 is detected by an existing angle reader (not shown). The stage control circuit 20 corrects the shifted position of the single-shaft transfer stage 11 due to vibration and corrects the angle of the rotation of the rotary stage 10.

As described above, the charged particle beam apparatus has a single set of the circuits (that are the image processing circuit 15, the signal processing circuit 16, the deflection control circuit 17 and the deflection drive circuit 18). The image processing circuit 15, the signal processing circuit 16, the deflection control circuit 17 and the deflection drive circuit 18 are shared by the defect inspection SEM and the defect review SEM as shown in FIG. 5. However, the charged particle beam apparatus may have two sets of the circuits (that are the image processing circuit 15, the signal processing circuit 16, the deflection control circuit 17 and the deflection drive circuit 18). That is, the one of the two sets of the circuits is provided for the defect inspection SEM, while the other of the two sets is provided for the defect review SEM. This configuration makes it possible to simplify a control algorithm and increase the speed of the algorithm. Furthermore, when a failure occurs in one of the two sets of the circuit, the other of the two sets can be used.

Figure 6:
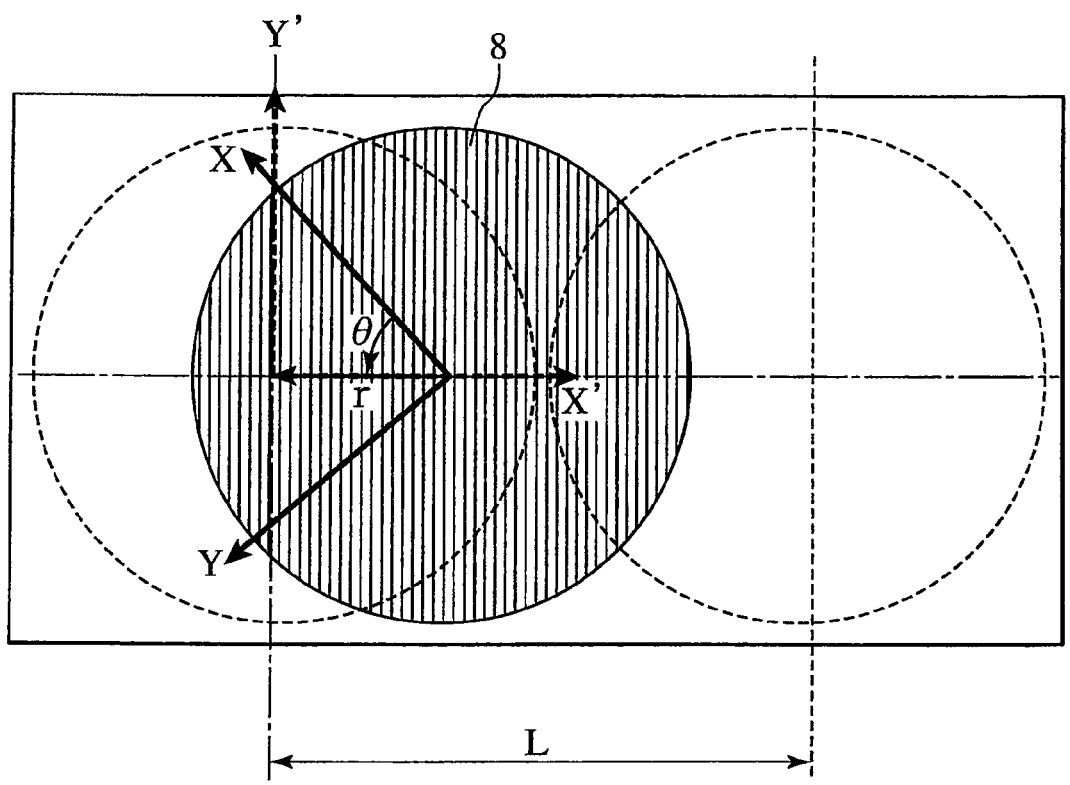
FIG. 6 is a plan view of a wafer placed on a stage and shows a movement of the wafer.

FIG. 6 is a plan view of the wafer 8 placed on the stage and shows the movement of the wafer. A symbol L shown in FIG. 6 denotes a distance between the centers of the two columns (SEMs). Circles represented by broken lines shown in FIG. 6 denote the wafer 8 moved in the vacuum chamber 12 in the longitudinal direction of the single-shaft transfer stage 11 and positioned at ends (rightmost and leftmost ends in FIG. 6) of the vacuum chamber 12. An advantage of the rotary stage 10 according to the present invention is that the size and weight of the rotary stage 10 are small. Also, another advantage of the rotary stage 10 according to the present invention is that when the rotary stage is rotationally symmetrical, vibration due to a moment generated during the movement does not occur in principle. However, as shown in FIG. 6, a rotation of a coordinate system occurs at a location (also called an observation location) at which the wafer is observed. It is therefore necessary to perform processing to erect (rotate) an obtained image.

The wafer 8 is represented by Cartesian coordinates defined by X and Y axes and by polar coordinates defined by r and θ axes. In FIG. 6, it is assumed that the wafer 8 is positioned at the observation location. The relationship between the Cartesian coordinates (X, Y) and the polar coordinates (r, θ) is represented by the following expressions.

$$X = r \cos \theta$$

$$Y = r \sin \theta$$

The amount of a movement of a rotary stage with reference to the reference Cartesian coordinates (X', Y') on a stage is represented by the following expression.

$$X' = r$$

$$\theta' = \pi - \theta$$

The above expressions are used to correct the coordinates of the defect.

Figure 7A:
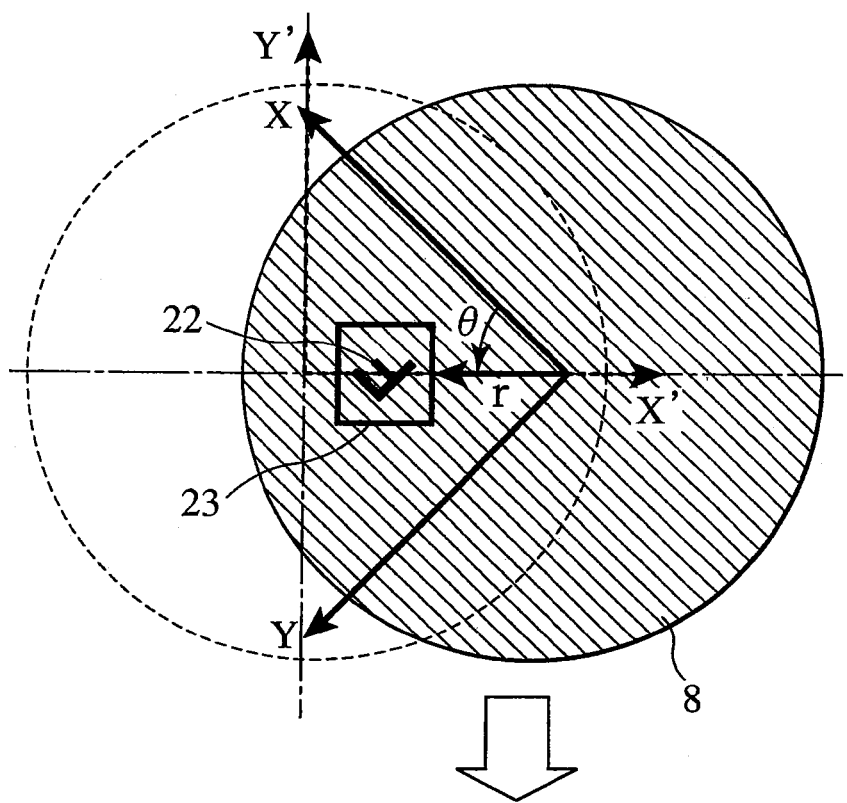
FIGS. 7A-7C are plan views of the wafer.
Figure 7B:
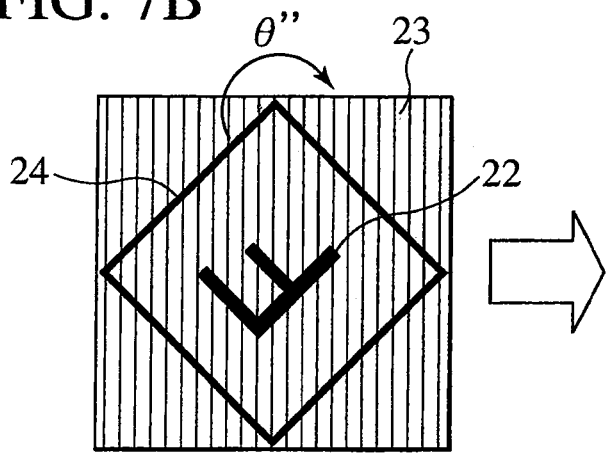
Figure 7C:
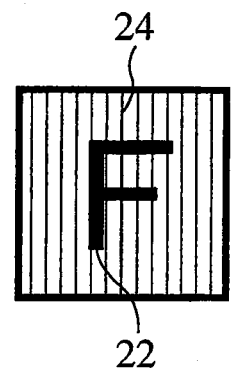

FIG. 7 is a plan view of the wafer 8 and shows an example of processing for acquiring an image in consideration of the rotation of the wafer 8. A pattern 22 present on the wafer 8 is imaged under the condition that the electron beam is deflected in a deflection area 23 represented in the polar coordinates (r, θ). When the defect inspection SEM images the pattern 22, the defect inspection SEM represents the imaged pattern 22 in the Cartesian coordinates (X, Y) in a direction shown in FIG. 7C. When the defect review SEM images the pattern 22, it is necessary to rotate the image at an angle θ" shown in the following expression in order to erect an image area 24 shown in FIG. 7B.

$$\theta'' = \pi + \theta$$

Therefore, after the deflection area 23 is set to include the image area 24, the defect review SEM images the pattern 22 and rotates the imaged pattern 22 to direct the image pattern 22 as shown in FIG. 7C. The rotation of the image can be performed by controlling a scanning direction of the electron beam or by performing image processing to rotate the image.

Figure 8A:
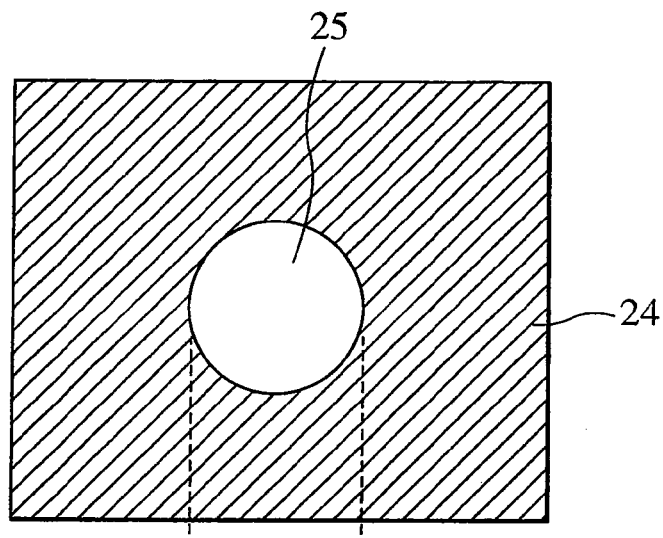
FIG. 8A is an enlarged plan view of a target object present on the wafer.
Figure 8B:
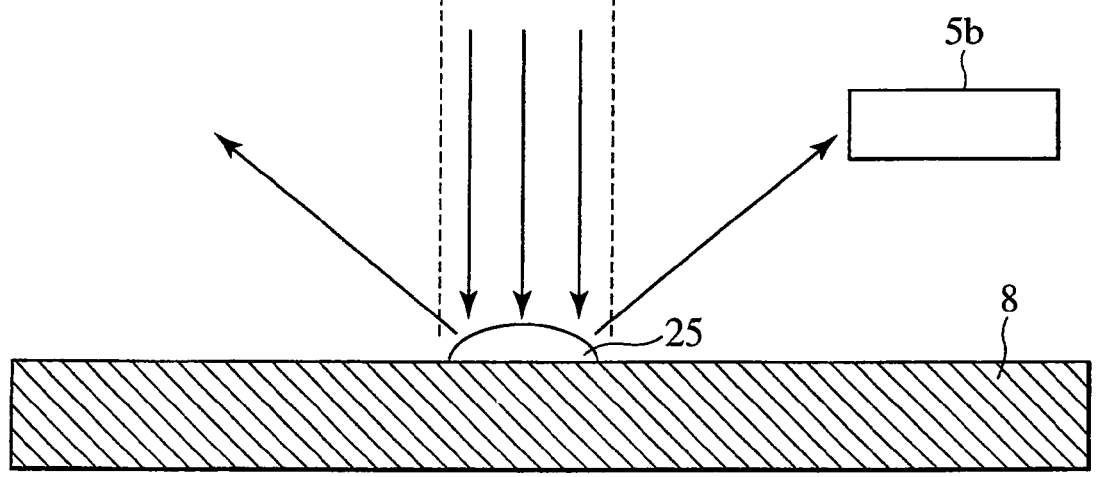
FIG. 8B is an enlarged side view of the target object present on the wafer.

FIG. 8A is an enlarged plan view of a target object present on the wafer. FIG. 8B is an enlarged side view of the target object present on the wafer. The image detected by each of the SEMs includes a target object 25 having a shade as shown in FIG. 8A. When the defect inspection SEM and the defect review SEM use an XY stage that does not rotate, it is necessary that a normal to the flat surface (on which the electron beam is detected) of the detector 5b of the defect inspection SEM be parallel to a normal to the flat surface (on which the electron beam is detected) of the detector 5a of the defect review SEM in order that the position (relative to the target object) of the shade obtained by the defect inspection SEM is the same as the position (relative to the target object) of the shade obtained by the defect review SEM. If electrons emanated from a three dimensional target object is detected at a high angle, the positions (relative to the imaged target object 25) of a bright portion and shade of an image obtained by the capture are shifted due to the angle (as if the bright portion and the shade were rotated in the image of the target object 25). In this case, the target object may be erroneously categorized, and it is required to carefully perform the categorization. An irregularity of the target object is important as information used to categorize the target object in some cases. However, when the convex target object 25 present in the image area 24 on the wafer 8 is detected by the detector 5b as shown in the side view of FIG. 8B and imaged by the defect review SEM, the image (of the target object 25) having the shade is obtained. In the charged particle beam apparatus according to the present invention, the normal to the surface (on which the electron beam is detected) of the detector 5a is directed toward the center of the column (defect review SEM) indicated by the broken line shown in FIG. 5, and the normal to the surface (on which the electron beam is detected) of the detector 5b is directed toward the center of the column (defect inspection SEM) indicated by the broken line shown in FIG. 5. Therefore, the position (relative to the imaged target object 25) of the shade generated in the image indicating the target object inspected by the defect inspection SEM is not shifted to the position (relative to the imaged target object 25) of the shade generated in the image indicating the target object inspected by the defect review SEM.

As described above, the present invention provides a charged particle beam apparatus capable of downsizing (resulting in a small installation space), reducing in cost, and having high reliability with suppressed vibration and reduced possibility of attachment of a foreign material. The charged particle beam apparatus is largely effective when a wafer having a large diameter is used.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A charged particle beam apparatus for irradiating a sample with a charged particle beam to inspect the sample, the apparatus comprising:
   a vacuum chamber to enclose the sample;
   a first column to irradiate the sample with a charged particle beam or light so as to image the sample;
   a second column to irradiate the sample with a charged particle beam so as to image the sample or process the sample based on the image obtained by the first column;
   a rotary stage that mounts the sample thereon, which is placed in the vacuum chamber; and
   a single-shaft transfer mechanism to transfer the rotary stage in the direction of an axis of the single-shaft transfer mechanism in the vacuum chamber,
   wherein a target portion for the irradiation of the charged particle beam or light from the first column and the charged particle beam from the second column in XY directions on the sample is positioned by combined movement of the rotary stage and the single-shaft transfer mechanism.

2. The charged particle beam apparatus according to claim 1, further comprising:
   a storage device that stores an image of the sample inspected by one of the first column and the second column and supplementary information as information shared with the first column and the second column.

3. The charged particle beam apparatus according to claim 1, wherein
   information on adjustment of a focal point of an electron beam obtained by one of the first column and the second column is used to adjust a focal point of an electron beam emitted by another column.

4. The charged particle beam apparatus according to claim 1, further comprising:
   a unit for measuring the amount of a rotation of the rotary stage; and
   a calculator for controlling deflection of a charged particle beam emitted by each of the first column and the second column, based on the measured amount of the rotation of the rotary stage.

5. The charged particle beam apparatus according to claim 1, further comprising:
   a unit for measuring the amount of a rotation of the rotary stage; and
   a calculator for controlling a rotation of an image obtained by each of the first column and the second column, based on the measured amount of the rotation of the rotary stage.

6. A charged particle beam apparatus for irradiating a sample with a charged particle beam to inspect the sample, the apparatus comprising:
   a rotary stage that mounts the sample;
   a single-shaft transfer stage that moves the sample mounted on the rotary stage, in the direction of an axis of the single-shaft transfer stage;
   a first column that irradiates the sample with a charged particle beam to detect a defect present on the sample;
   a second column that detects the defect, based on coordinates of the defect detected by the first column; and
   a vacuum chamber that mounts the first column and the second column in line with the single-shaft transfer stage, wherein:
   the vacuum chamber has a smaller and larger dimension on a cross section parallel to a base of the vacuum chamber,
   the larger length of the vacuum chamber in a direction of the axis of the single-shaft transfer stage is determined by adding a margin to the double of the outer diameter of the sample, and
   the smaller length of the vacuum chamber in a direction crossing the axis of the single-shaft transfer stage in a plane is determined by adding a margin to the outer diameter of the sample.

7. The charged particle beam apparatus according to claim 6, wherein:
   the first and second columns have respective detectors,
   the detectors have respective surfaces on which charged particle beams are detected,
   a normal to the surface of the detector of the first column is directed toward the center of the first column and
   a normal to the surface of the detector of the second column is directed toward the center of the second column.

8. A charged particle beam apparatus for irradiating a sample with a charged particle beam to inspect the sample, the apparatus comprising:
- a rotary stage that mounts the sample;
- a single-shaft transfer stage that moves the sample mounted on the rotary stage, in the direction of an axis of the single-shaft transfer stage;
- a vacuum chamber having the single transfer stage therein;
- a first column that irradiates the sample with an optical beam to detect a defect present on the sample; and
- a second column that detects the defect, based on coordinates of the defect detected by the first column, wherein:
- the vacuum chamber has a smaller and larger dimension on a cross section parallel to a base of the vacuum chamber,
- the larger length of the vacuum chamber in a direction of the axis of the single-shaft transfer stage is determined by adding a margin to the double of the outer diameter of the sample, and
- the smaller length of the vacuum chamber in a direction crossing the axis of the single-shaft transfer stage in plane is determined by adding a margin to the outer diameter of the sample.

* * * * *